(12) United States Patent
Fernandes (10) Patent No.: US 8,467,242 B2
(45) Date of Patent: *Jun. 18, 2013

(54) DYNAMICALLY CONFIGURABLE MLC STATE ASSIGNMENT

(75) Inventor: Brandon Lee Fernandes, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 216 days.

This patent is subject to a terminal disclaimer.

(21) Appl. No.: 12/968,529

(22) Filed: Dec. 15, 2010

(65) Prior Publication Data

US 2011/0080786 A1    Apr. 7, 2011

Related U.S. Application Data

(63) Continuation of application No. 12/136,470, filed on Jun. 10, 2008, now Pat. No. 7,855,913.

(51) Int. Cl.
    *G11C 16/04*    (2006.01)

(52) U.S. Cl.
    USPC ............ 365/185.03; 365/185.12; 365/185.28; 365/185.29

(58) Field of Classification Search
    USPC .............. 365/185.03, 185.12, 185.28, 185.29
    See application file for complete search history.

(56) References Cited

U.S. PATENT DOCUMENTS

| | | | |
|---|---|---|---|
| 6,292,868 B1 | 9/2001 | Norman | |
| 7,295,475 B2 | 11/2007 | Akaogi et al. | |
| 7,457,155 B2 | 11/2008 | Nazarian | |
| 7,855,913 B2 * | 12/2010 | Fernandes | 365/185.03 |
| 2007/0014153 A1 | 1/2007 | Gorobets et al. | |
| 2007/0280031 A1 | 12/2007 | Maejima et al. | |
| 2008/0084751 A1 | 4/2008 | Li et al. | |
| 2008/0270679 A1 | 10/2008 | Joo | |

OTHER PUBLICATIONS

Lee et al. "A 32Gb MLC NAND-Flash Memory with $V_{th}$-Endurance-Enhancing Schemes in 32nm CMOS", 2010 IEEE International Solid-State Circuits Conference, Feb. 10, 2010, pp. 446-448.

* cited by examiner

*Primary Examiner* — Hoai V Ho
(74) *Attorney, Agent, or Firm* — Leffert Jay & Polglaze, P.A.

(57) ABSTRACT

Memory devices and methods are disclosed, such as those facilitating a data conditioning scheme for multilevel memory cells. For example, one such memory device is capable of inverting the lower page bit values of a complete page of MLC memory cells when a count of the lower page data values is equal to or greater than a particular value or a comparison of current levels compared with a reference current level is equal to or exceeds some threshold condition. Memory devices and methods are also disclosed providing a means for determining initial programming pulse conditions for a population of memory cells based on the number of lower page data values being programmed to a logical 0 or a logical 1 data state.

23 Claims, 8 Drawing Sheets

DYNAMICALLY CONFIGURABLE MLC STATE ASSIGNMENT

RELATED APPLICATION

This application is a continuation of U.S. application Ser. No. 12/136,470, titled "DYNAMICALLY CONFIGURABLE MLC STATE ASSIGNMENT," filed Jun. 10, 2008, now U.S. Pat. No. 7,855,913 (allowed), which is commonly assigned and incorporated herein by reference.

TECHNICAL FIELD

The present disclosure relates generally to memory devices, and in a particular embodiment, the present disclosure relates to methods and apparatus for providing reconfigurable multilevel memory state assignments.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Flash memory devices typically use a one-transistor memory cell that allows for high memory densities, high reliability, and low power consumption. Changes in threshold voltage (Vt) of the cells, through programming or "writing" of charge storage nodes (e.g., floating gates or trapping layers or other physical phenomena), corresponds to the data "stored" on each cell. By defining two or more ranges of threshold voltages to correspond to individual data values, one or more bits of data may be stored on each cell (in some cases, this may also be referred to as storing "in" a cell or stored "by" a cell, but there is no distinction intended by such differences in terminology). Memory cells storing one bit of data by utilizing two threshold voltage ranges are typically referred to as Single Level Cell (SLC) memory cells. Memory cells storing more than one bit of data on a cell by utilizing more than two possible threshold voltage ranges are typically referred to as Multilevel Cell (MLC) memory cells, although MLC memory cells can refer to any cell that can be used to store more than two threshold voltage ranges.

MLC technology permits the storage of more than one bit on a cell, depending on the quantity of threshold voltage ranges assigned to the cell and the stability of the assigned threshold voltage ranges during the lifetime operation of the memory cell. The number of threshold voltage ranges, which are sometimes referred to as Vt distribution windows, used to represent a bit pattern comprised of N-bits is $2^N$.

Figure 1:
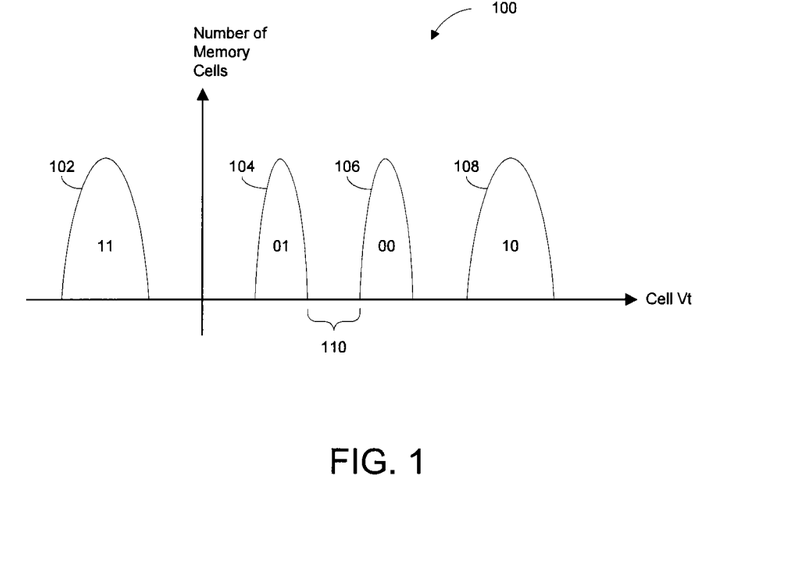
FIG. 1 is a diagram showing threshold voltage distributions levels for a plurality of MLC memory cells.

FIG. 1 illustrates an example threshold voltage distribution 100 for a population of MLC memory cells. For example, a cell may have a Vt that falls within one of four different voltage ranges 102/104/106/108 of 200 mV, each being used to represent a data state corresponding to a respective bit pattern comprised of two bits. Typically, a dead space 110 (which is sometimes referred to as a margin) of 0.2V to 0.4V is maintained between each range to keep the Vt ranges from overlapping. If the threshold voltage of the cell is within the first of the four Vt ranges 102, the cell in this case is storing a logical 11 state and is typically considered the erased state of the cell. If the voltage is within the second of the four Vt ranges 104, the cell in this case is storing a logical 01 state. A voltage in the third range 106 of the four Vt ranges would indicate that the cell in this case is storing a logical 00 state. Finally, a Vt residing in the fourth Vt range 108 indicates that a logical 10 state is stored on the cell.

Another characteristic of MLC memory cells which distinguishes it from SLC memory is that the Vt ranges in MLC memory cells tend to be much narrower and closer together than in SLC memory cells. These narrow ranges should be reliably maintained in order to prevent corruption of the data stored on the memory cells. MLC memory also generally requires that several high voltage pulses be applied to shift memory cell thresholds to the higher threshold voltage ranges such as those ranges 106 and 108 corresponding to the 00 and 10 states. Typically, the most positive memory cell threshold voltage range (e.g., range 108) requires the greatest number and magnitude of programming pulses. As the number and magnitude of these applied programming pulses increases in order to achieve a higher threshold voltage, undesirable effects can result on both the memory cells being programmed (e.g., selected memory cells) and on unselected memory cells nearby. For example, the increased magnitude of the programming pulses can add additional gate stress to the memory cells. The number and magnitude of the applied programming pulses can also cause shifts, also referred to as program disturbs, in the programmed Vt state of nearby memory cells due to capacitive coupling effects, for example.

Flash memory typically utilizes one of two basic architectures known as NOR flash and NAND flash. The designation is derived from the logic used to read the devices. In NOR flash architecture, a column of memory cells are coupled in parallel with each memory cell coupled to a data line, commonly referred to as a bit line. In NAND flash architecture, a column of memory cells are coupled in series with only the first memory cell of the column coupled to a bit line.

Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

For the reasons stated above, and for other reasons that will become apparent to those skilled in the art upon reading and understanding the present specification, there is a need in the art for alternative programming methods for programming MLC memory cells.

DETAILED DESCRIPTION

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the embodiments of the invention, and it is to be understood that other embodiments may be utilized and that electrical, mechanical or process changes may be made without departing from the present disclosure. The following detailed description is, therefore, not to be taken in a limiting sense.

Figure 2:
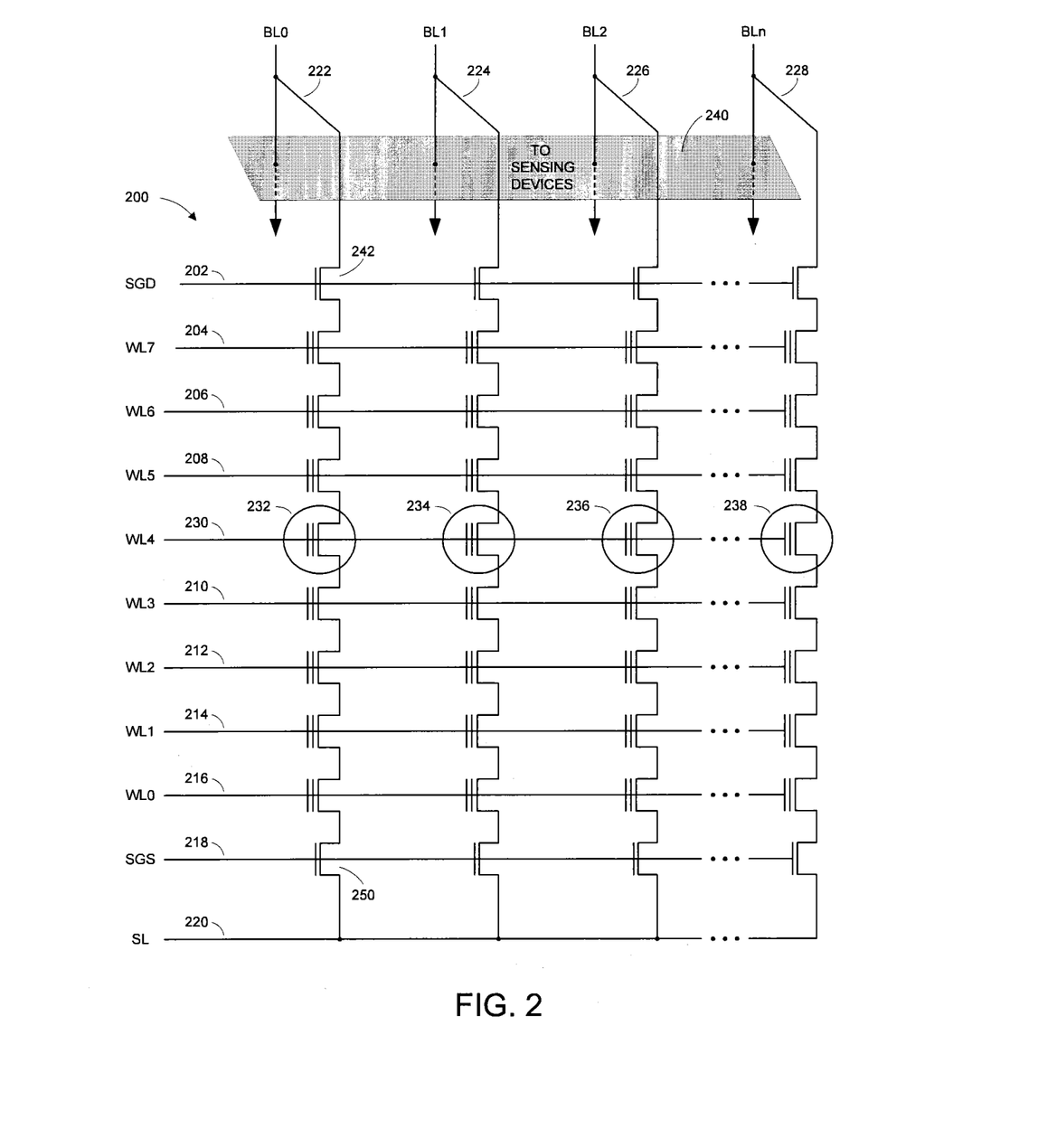
FIG. 2 is a diagram showing an array of NAND memory cells according to an embodiment of the disclosure.

Flash memory cells are typically arranged in arrays of memory cells comprising logical rows (e.g. memory cells coupled to word lines) and columns (e.g. memory cells coupled to bit lines) as illustrated in FIG. 2. A given row is typically divided up into what are referred to in the art as pages of data. For example, a page may be defined as being a 2,048 byte data storage region plus an additional 64 byte overhead storage region. Page sizes according to the embodiments of the present disclosure may vary from the 2,048 byte plus 64 bytes, for example. A page could be comprised of an entire row of memory cells. In the case of MLC memory, each memory cell of a given page can store multiple pages (e.g., bit values) of data. For example, in an MLC memory cell storing two bits of data, the memory cell could have what is often referred to as upper and lower page data. MLC memory cells storing three bits of data can have upper, middle, and lower page data stored on the cell. Typically, in a two bit MLC memory cell storing a bit pattern of XY (e.g. 11, 01, 00 or 10) the X bit is referred to as the upper page bit and the Y bit is referred to as the lower page bit. However, the designations of upper and lower are arbitrary as long as they are consistently utilized in regards to the device.

Memory cells 232-238 sharing a common access line, such as a word line 230 (which may consist of, e.g., commonly coupled control gates of a conventional flash memory cell) are subjected to programming at the same time although potentially to different threshold voltages (e.g., data states). Although some of the memory cells may be inhibited from programming, they would still be subjected to the same control gate voltages as uninhibited memory cells on the same word line. Memory cells on the same word line can inhibited from further programming by techniques such as manipulation of bit line voltages as is known to those skilled in the art, for example. NAND strings of flash memory cells are arranged in logical columns of multiple memory cells, each coupled drain to source as shown in FIG. 2 such as those located between gates 242 and 250. A drain select gate 242 couples one end of the NAND string to an associated bit line BL0 222. A source select gate 250 couples the opposing end of the NAND string to a common source line 220. Each bit line 222-228 is further coupled to sensing devices 240 (e.g., sense amplifiers whose detail is not shown.) Sense amplifiers and other sensing devices are known to those skilled in the art and are therefore not discussed further in relation to various embodiments of the present disclosure. FIG. 2 illustrates four bit lines. However, many more bit lines with associated NAND strings can exist as indicated by bit lines BL0-BLn 222-228 as shown in FIG. 2.

Flash memory cells are generally erased in blocks wherein all the threshold voltages of the memory cells in the block are returned to a common state. This state is typically referred to as the 'erased' or 11 state, as shown in FIG. 1. Flash memory cells are typically programmed a logical row at a time as indicated by the circled memory cells 232-238 of FIG. 2. Many more than four memory cells 232-238 shown in FIG. 2 may exist per row 230. Programming is accomplished by providing pulses of a programming voltage to the word line 230 coupled to the row of memory cells to be programmed 232-238. With each programming pulse that is applied, the threshold voltages of the memory cells selected for programming are shifted by some amount. Once a memory cell has reached its intended threshold voltage level the cell is inhibited from further programming by techniques such as manipulation of bit line voltages as is known to those skilled in the art. This process continues until the threshold voltages for the memory cells have all reached their intended range 102-108 as shown in FIG. 1. As discussed above, the memory cells of a row will likely store different data states and thus each memory cell will have different final programmed threshold voltages. For example, if the memory cell 234 of FIG. 2 is to be programmed to a 01 data state and memory cell 238 is to be programmed to a 00 data state, then memory cell 238 will typically require more programming pulses to achieve its intended data state than memory cell 234. In addition, the programming voltage is typically increased after each application of a programming pulse. For example, a first programming pulse may be equal to 14V, the second programming pulse may be increased to 15V, the third pulse increased to 16V and so on. These programming pulses needed to complete programming of the memory cells 232-238 in this example can cause a number of issues. One issue is the more programming pulses that need to be applied increase the time that is required to complete programming of the memory cells for the row of memory being programmed. Further, these additional programming pulses can cause undesirable shifts, or 'program disturb,' in memory cells of the selected row, and potentially adjacent rows, that have already achieved their intended threshold voltage level. As the programming potential of each programming pulse increases, these disturb effects can also increase. The embodiments of the present disclosure provide methods and apparatus to mitigate these program disturb issues, reduce the number of applied programming pulses, reduce the magnitude and duration of the applied programming pulses and/or reduce the overall time needed to program a row of memory cells.

Programming of memory cells can be accomplished through a process known as Fowler-Nordheim tunneling wherein charges originating in a channel region of the memory cell are forced through an insulating layer where they are then trapped in a charge storage node (e.g., floating gate.) The more charges that are trapped in the charge storage node the higher the threshold voltage for the memory cell will be. The rate of charge tunneling is dependent on the potential difference between the programming voltage applied to the control gate and the potential of the channel region of the memory cell. Programming may also be accomplished through direct injection of charge carriers.

It has been proposed in U.S. Pat. No. 6,292,868 (issued Sep. 18, 2001) that the power required to program a population of memory cells in an SLC memory device storing either a 1 or a 0 data state can be reduced by inverting all the programmed states of the memory cells (e.g., either 1 or 0) if the number of memory cells to be programmed from the erased state exceeds (e.g., is above or greater than) a predetermined percentage of the total number of memory cells. This method thus inverts all bits of data acted upon by the method of the '868 patent. However, mere inversion of all bits based upon whether a number of memory cells to be programmed exceeds a threshold value becomes nonsensical in an MLC device where inverted data patterns do not mean the difference between programming or inhibiting a memory cell.

Figure 3:
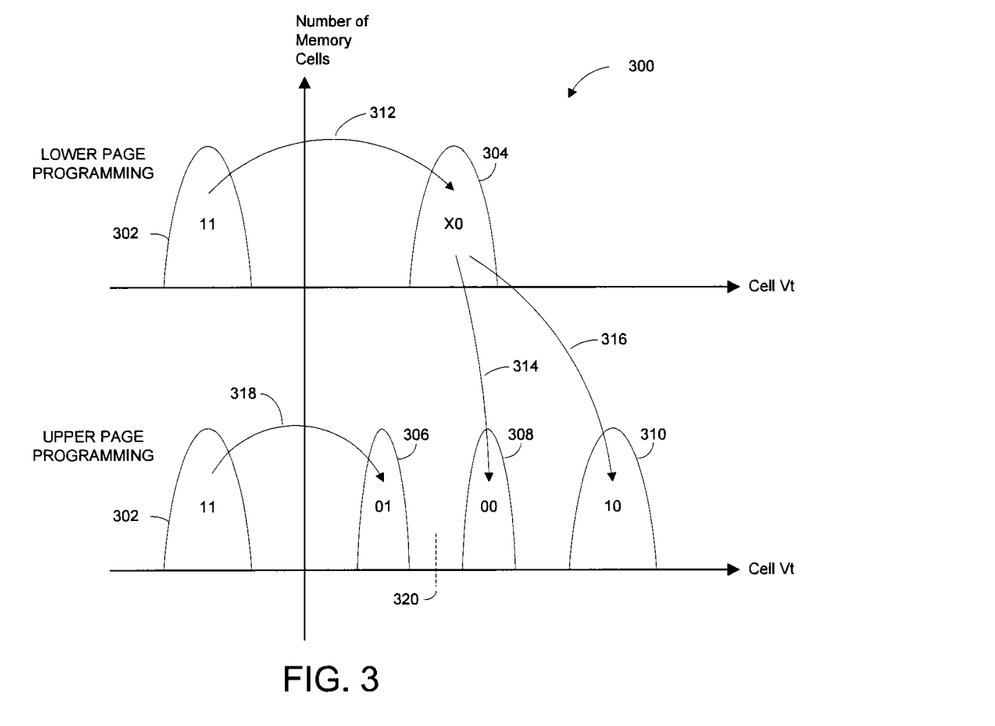
FIG. 3 is a diagram showing a threshold voltage distribution during a programming operation according to an embodiment of the disclosure.

An embodiment of the present disclosure will be discussed in part by way of reference to FIG. 3. FIG. 3 illustrates threshold voltage shifts according to an embodiment of the present disclosure. The distributions 300 shown in FIG. 3 illustrate the possible intended distribution of threshold voltages after completing a given programming operation on a row of memory cells. Programming of lower pages of data are typically done followed by upper page programming. However, it is possible that a particular memory cell will only experience a lower page programming operation or only experience an upper page programming operation depending on the data value to be stored in the particular cell. The shift operation (e.g., programming operation) 312 of FIG. 3 illustrates the threshold voltage shift of memory cells undergoing a lower page data programming operation. For example, in two bit MLC memory cells wherein the lower page data bit is to be programmed, the memory cells threshold voltages are shifted from the 11 erased state to the X0 intermediate state during the lower page programming operation 312. In the 312 programming operation, the X bit is a 'don't care' bit. Memory cells at the X0 state are then processed further based on the intended upper page data programming state of the memory cells. For example, a cell currently at the X0 state and having an intended upper page data value of 1, will be further programmed 316 to reside in the 10 state (range 310). Memory cells residing in the X0 state which have an intended upper page data value of 0, will be further programmed 314, if required, to reside in the 00 state (range 308).

The upper pages of memory cells having a lower page data value of 1 (e.g., erased value) are processed as shown with respect to the programming operation 318. For example, memory cells having an intended upper page and lower page data value of 1 remain in the 11 (erased) state (range 302). Memory cells having an intended lower page data value of 1 and an intended upper page data value of 0 are further processed 318 to shift the threshold voltage to the 01 state (range 306). According to one or more embodiments and as shown in FIG. 3, the data values (e.g., 11, 01, 00, 10) are assigned to each range such that the data values of adjacent ranges differ by only one digit (e.g., bit.) Thus, FIG. 3 illustrates a MLC programming distribution 300 after completion of programming.

As discussed above, the further the threshold voltage of a memory cell needs to be shifted, the more ever increasing in magnitude programming pulses are needed to achieve the desired threshold voltages. For example, programming memory cells to range 310 will require a greater total number of programming pulses at a higher potential than memory cells to be programmed to the 306 range. The greater the number and magnitude of programming pulses applied to a control gate increases the time to complete the programming operation and further increases the program disturb effects on other memory cells near the cells being programmed. One or more embodiments of the present disclosure address these issues by analyzing the intended programmed states of a number (e.g., a page) of MLC memory cells and dynamically assign state assignments to reduce the number of memory cells being programmed to the higher level data states. For example, according to various embodiments the state assignments can be dynamically assigned so as to reduce the number of memory cells undergoing a lower page programming operation such as 312. This results in a reduction of memory cells undergoing the programming operations 314, 316 and an increase of memory cells undergoing the programming operation 318, for example. This has the effect of an overall reduction in the number of memory cells being programmed to data states above the intermediate point (e.g., midpoint) 320 in one or more embodiments as illustrated in FIG. 3. Additional embodiments may have different numbers of data states on either side of point 320.

Figure 4:
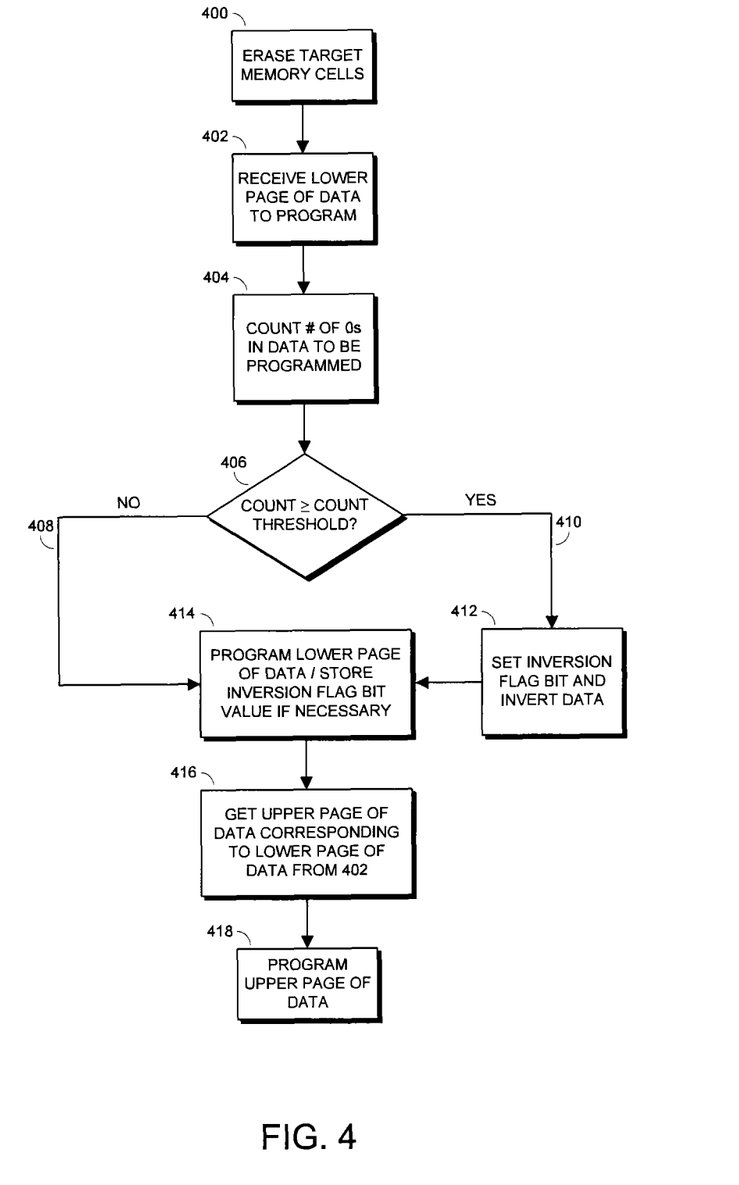
FIG. 4 is a diagram of a flow chart according to an embodiment of the disclosure.

FIG. 4 is a process diagram according to an embodiment of the present disclosure. An entire page or a block of memory cells along with their respective inversion flag bits, as discussed subsequently, are erased 400 in preparation for a future programming operation. Entire pages of memory cells are erased as the embodiment performs a programming operation on an entire page of memory cells as opposed to a partial page programming operation. According to the embodiment illustrated in FIG. 4, a page of MLC memory cell data (e.g., lower page of original source data) is made available 402, for example by a connected host or other processor, that is intended to be programmed in a memory device. An example of a memory device can be a memory array of MLC Flash memory cells as illustrated in FIG. 2. A count is then performed 404 on the received data to determine how many 0s exist to be programmed in the lower page of each MLC memory cell. As illustrated in FIG. 3, a lower page bit value of 0 indicates that a memory cell needs to be programmed to a higher range 308 or 310. Alternate embodiments may count the number of 1s that exist in the received data. The count is performed on data (e.g., lower page data) that is intended to be programmed to the same page (e.g., same row) of memory cells. Various means can be employed to accomplish the count operation 404 or equivalent determining factors. A digital adder as is known in the art can be utilized to count the number of 0s existing in lower page values of the page of data to be written. Such digital adders might consist of a serial adder, ripple carry adder, carry look ahead adder, Manchester adder, Kogge-Stone adder, carry save adder or a carry select adder, for example. An alternate method of determining the number of lower page data values to be programmed according to various embodiments of the present disclosure is to perform a cumulative current measurement in the data cache of the memory device. The data cache (e.g., cache register) is discussed subsequently with respect to FIG. 8. The cumulative current measurement is then compared to a reference current value. If the cumulative current measurement exceeds the reference current, that would indicate that a number of lower page bits are to be programmed that justifies inverting the lower page bits of the data to be written.

Each page of the memory device has an inversion flag bit that is associated with it. An inversion flag bit that is in a set condition (e.g., equal to a logical 1 or 0) indicates an inversion operation has occurred as described subsequently. According to one or more embodiments, the inversion flag may be implemented by utilizing a plurality of bits instead of a single bit. A majority vote calculator can then be used to ensure high reliability of the inversion status of the data. A comparison is then made 406 to determine if the count of 0s is greater than a particular threshold count value. It will be noted that the condition "greater than a threshold count value" may be equivalent to the condition "equal to or greater than a threshold count value" upon designating the appropriate threshold count values. For example, the condition "greater than a threshold count value of 49" is equivalent to the condition "equal to or greater than a threshold count value of 50." The threshold count value may be provided as a fixed number or may be expressed as a percentage, or fraction, of the number of memory cells involved in the counting operation.

If the count is less than the threshold count value 408, the data is written to the MLC memory cells without further data conditioning 414. If it is found that the count exceeds the threshold count value 410, then the data undergoes further conditioning. For example, the lower page data values are inverted 412 (e.g., 1 to 0, 0 to 1) and an inversion flag bit associated with the now inverted data is then set 412 to indicate the lower page data has been inverted. Different embodiments may also set the associated inversion flag bit 412 either before or concurrently with the inversion of the lower page of data 412.

Following the inversion of the lower page of data and setting the inversion flag bit 412, the data along with its associated inversion flag bit is then written to the memory 414. Various embodiments can write the inversion flag bit following (e.g., appended to) the data or the inversion flag bit may be stored in a different location in the memory device. For example, the flag bit may be stored in the additional 64 byte storage region as part of a page of memory. Subsequent to the programming of the lower page of data 414, the corresponding upper page data (e.g., upper page data sharing the same wordline as lower page data 414) is obtained 416 and programmed 418.

Figure 5:
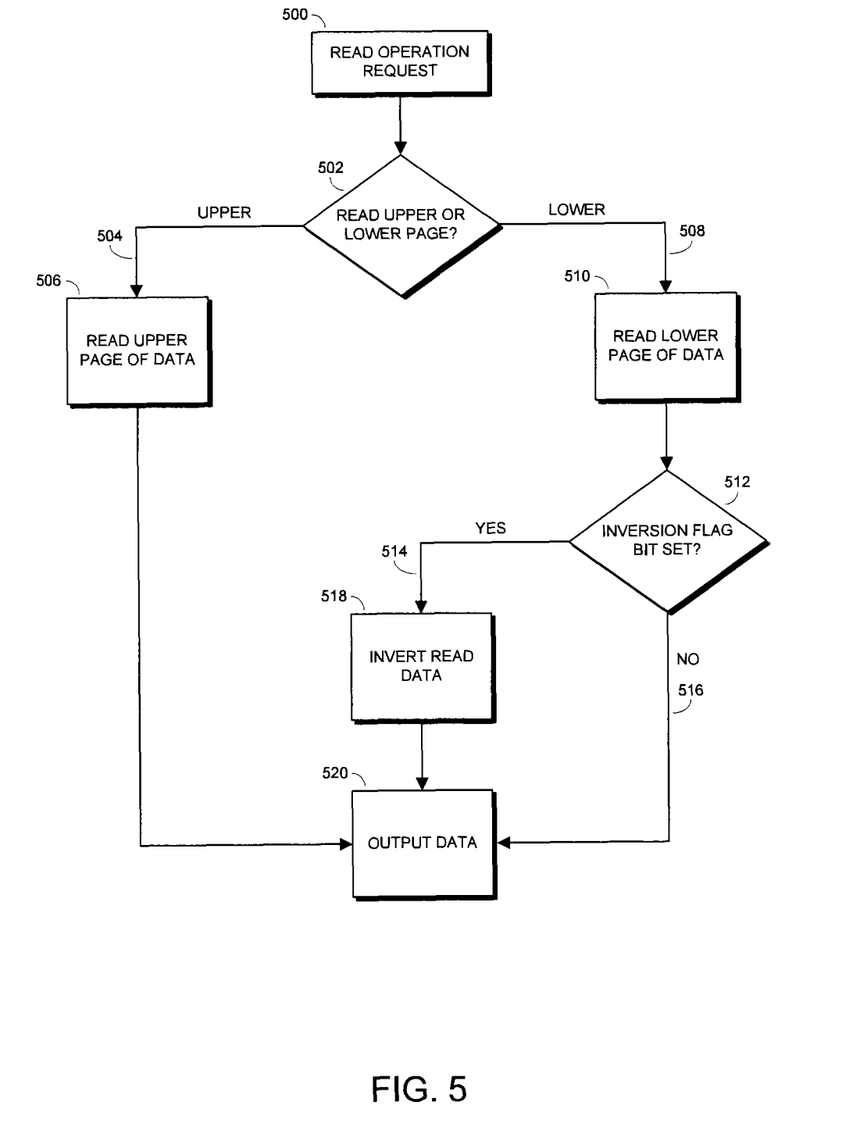
FIG. 5 is a diagram of a flow chart according to an embodiment of the disclosure.

At some time following the write operation illustrated by reference to FIG. 4, a read operation of data in the memory device as illustrated by FIG. 5 may be requested 500. For example, a host controller or processor attached to the memory device which had previously supplied original data to be stored in the memory device may request a read operation of the data be performed 500. A determination is first made to determine if the requested data to be read is located in an upper or a lower page of memory 502. If the read request 500 is to read data from the upper page 504 then a read operation of the upper page of data 506 is performed and the read data is subsequently output 520. If the read request is to read data from a lower page 508 the lower page is then read 510. A determination is made following the read operation of the lower page of data 510 to determine if the inversion flag corresponding to the read data is set 512. In at least one embodiment according to various embodiments of the present disclosure, the determination of the state of the inversion bit (e.g., set or not set) is made in parallel with the lower page read operation. If the inversion flag is set 514, the data read from the lower page is inverted 518 and outputted 520. If the inversion flag is not set 516, the data read from the lower page is outputted 520 without performing an inversion operation. Thus, data that had been inverted according to various embodiments of the present disclosure has been restored to the initially intended state (e.g., its original or "source" state).

Figure 6:
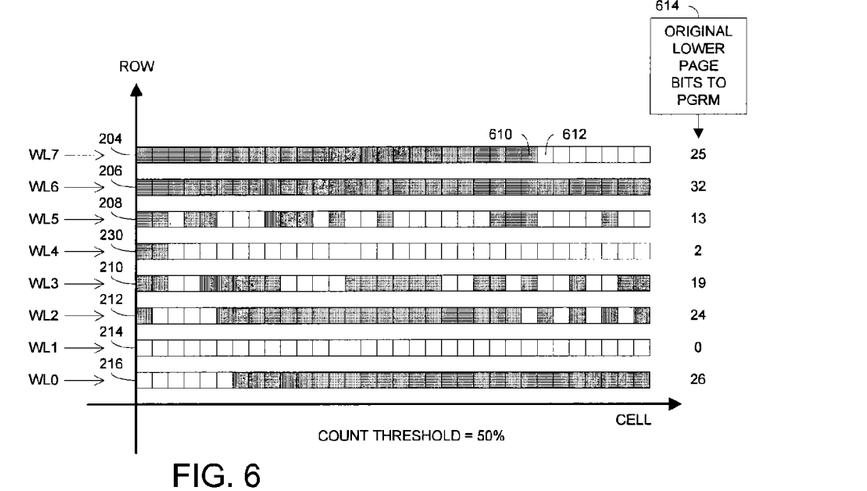
FIG. 6 is a diagram showing an example of a plurality of memory cells and their initial intended programming states according to an embodiment of the disclosure.
Figure 7:
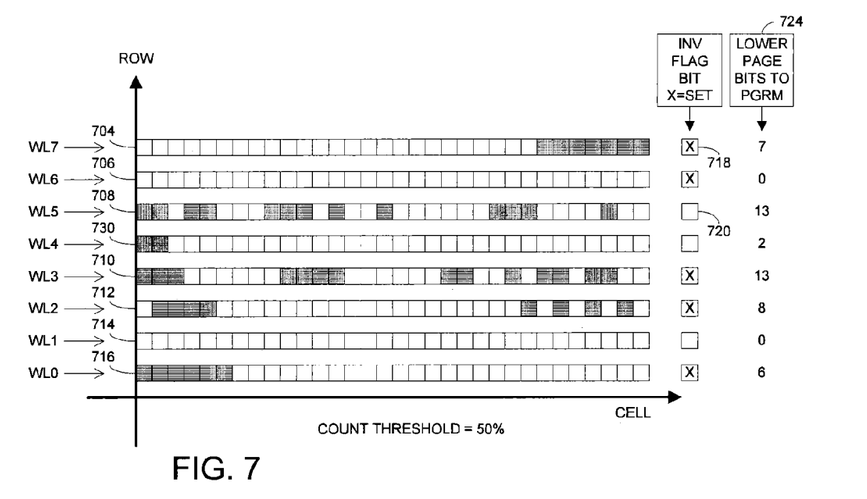
FIG. 7 is a diagram showing a plurality of memory cells along with their intended programming states according to an embodiment of the disclosure.

FIGS. 6 and 7 provide a graphical representation of an embodiment according to the present disclosure. Each square (e.g., 610/612) of each horizontal bar represents an MLC memory cell coupled to its respective word line 204-216, 230 similar to the word lines illustrated in FIG. 2. However, the embodiments are not limited to the number of memory cells and word lines shown in FIGS. 6 and 7. Memory arrays according to the present disclosure can include many more memory cells and word lines than shown in FIGS. 6 and 7. The shaded blocks 610 indicate a memory cell having an intended (e.g., original) lower page data value of 0. In this example, a lower page data value of 0 indicates a programming operation is needed as illustrated by the lower page programming operation 312 shown in FIG. 3. Non-shaded blocks 612 of FIGS. 6 and 7 indicate memory cells wherein the intended lower page data value is a 1. These memory cells will either remain in the 11 state 302 or may be programmed 318 to the 01 state 306 as illustrated in FIG. 3. Although the embodiment illustrated in FIGS. 6 and 7 have a designated threshold count value of 50%, any percentage, or equivalent means to determine a threshold count value has been exceeded, between approximately 50% and 100%, are possible according to various embodiments such that digits of the data may be inverted if half or more of the cells are to require a programming operation. Embodiments employing a count of lower page memory data values that do not require a programming operation (e.g. logical 1 value instead of logical 0) can utilize a threshold count value between 0% and approximately 50%. However, because the subsets of memory cells requiring or not requiring a program operation are mutually exclusive, determining a count of memory cells not requiring a program operation inherently determines a count of memory cells requiring a program operation. Referring again to the example embodiment of FIGS. 6 and 7, a threshold of 50% is used for the count of memory cells initially intended to have lower page data values of a 0 data state.

Each row of memory cells illustrated in FIGS. 6 and 7 is comprised of 32 memory cells. Thus, the lower page values of each memory cell in a page (e.g., a row or partial row) of cells having 16 or more shaded cells will undergo an inversion operation using a threshold count value of approximately 50%. The result of this inversion operation on the rows of memory cells of FIG. 6 204-216, 230 according to one or more embodiments is illustrated in FIG. 7. For example, WL7 204 of FIG. 6 has 25 cells that will require a lower page programming operation as indicated by the shaded cells. WL7 704 of FIG. 7 indicates that after the inversion operation of the lower page bits according to the embodiments of the present disclosure, only 7 cells now need a lower page programming operation. It should also be noted that the inversion flag bit 718 associated with WL7 704 has been set. In a further example, WL5 208 of FIG. 6 indicates that 13 memory cells require a lower page programming operation be performed as indicated by the shaded cells. Because only 13 memory cells of WL5 208 require a lower page programming operation and the threshold count value (50% in this example) is 16, the lower page bit values of WL5 208 do not undergo an inversion operation. This result is illustrated by WL5 708 of FIG. 7 in that the same shaded cells appear in WL5 208 of FIG. 6 and WL5 708 of FIG. 7. The inversion flag bit of WL5 720 has also not been set indicating that the data has not undergone any conditioning, i.e., modification, from its original state. It should be noted that with respect to FIGS. 6 and 7, that the value of the upper page data state is not affected whether or not the lower page data state was altered according to various embodiments of the present disclosure. That is, the upper page data value is neither inverted when writing to the memory device nor when reading from the memory device.

Without having the benefit of the methods according to embodiments of the present disclosure, the example illustrated in FIG. 6 would result in 141 (summation of column 614) memory cells programmed to the 00 or 10 states. FIG. 7 illustrates that utilizing the embodiments of methods according to the present disclosure, a total of 49 (summation of column 724) memory cells would be programmed to the 00 or 10 state as opposed to 141 memory cells as shown in FIG. 6. This significant reduction in the number of memory cells undergoing a lower page programming operation can reduce the number of memory cells being programmed to the higher data states such as 308 and 310 as shown in FIG. 3, for example. This results in a fewer number and lower magnitude of programming pulses that need to be utilized during a programming operation which thereby can reduce the possibility of program disturb, reduce gate stress on the memory cells and/or reduce the time required to perform the programming operation. One or more of the embodiments of the present disclosure serve to redistribute the threshold voltages of a page of memory cells and not simply invert all the data states of the memory cells. The method of the '868 patent referenced above, in the case where a decision has been made to invert the data, results in memory cells that were to remain erased to now be programmed and memory cells originally to be programmed to now be held in an erased state. The embodiments of the present disclosure are not so limited.

The benefit of the embodiments of the present disclosure can also be illustrated with reference to TABLE 1. Table 1 illustrates a worst case scenario for the final programmed data levels (e.g., distributions) for an example population of 100,000 memory cells and a 50% threshold count value. The conclusions of Table 1 also applies to memory cell populations of different numbers of memory cells. The worst case scenario for the embodiments of the present disclosure utilizing a 50% threshold count value is 50% of the memory cells will be programmed to the 01 state and 50% will be programmed to 10 state. This is in contrast with the worst case scenario of 100% of the memory cells residing in the 10 state when the methods of the present embodiments are not utilized. The worst case scenario illustrated by Table 1 for the prior art method of writing data as received without data conditioning would be all 100,000 memory cells programmed to the 10 state. However, according to one or more embodiments of the present disclosure, having more than 50,000 cells with an initially intended data state calling for a lower page programming operation would result in an inversion of the lower page data assuming a greater than 50% threshold count value. Thus, the worst case scenario for utilizing data conditioning methods of embodiments of the present disclosure would be a situation wherein half of the memory cells are to be programmed to the 10 state and half to the 01 state.

TABLE 1

Worst Case Final Programmed Data States

| | Final Programmed Level/Data State | | | |
|---|---|---|---|---|
| Method Utilized | 11 | 01 | 00 | 10 |
| Without Data Conditioning | 0 | 0 | 0 | 100,000 |
| With Dynamic MLC Data State Conditioning | 0 | 50,000 | 0 | 50,000 |

Additionally, the result of the count operation (e.g., summation of 1s or 0s) performed can also be utilized to determine an initial programming voltage for a page of memory cells. As discussed above, flash memory cells are programmed by applying a sequence of ever increasing voltage level pulses, typically up to some particular saturation level, to a word line until all of the memory cells coupled to the word line have reached their desired state. Different memory cells may require a different amount and magnitude of programming pulses to reach the same state. For example, a group of memory cells may all be programmed to the same state. Some of the group may require a 16V programming voltage wherein other cells may require an 18V programming voltage. Thus, if a relatively low number of cells require a lower page data programming operation, a lower initial programming voltage can be used. As the number of memory cells requiring a lower page programming operation increases, statistically speaking it is more likely that some of the memory cells would benefit from a higher initial programming voltage. Thus, as the number of memory cells requiring a lower page programming operation increases, the initial programming voltage level should also be increased. This results in an increase in programming efficiency and less of a chance of program disturb because in some situations lower programming voltages are utilized. Thus, the initial programming potential can be, at least in part, a function of the count (e.g., Initial_Programming_Voltage=f(count)). Thus, utilizing the result of a summation of 1s or 0s operation discussed above to determine an initial programming voltage for a page of memory cells increases efficiency and reduces the possible effects of programming disturb. For example, the function may yield the initial programming pulse conditions shown in Table 2. Other embodiments consider the count to not only adjust the magnitude of the programming potential pulses but also to adjust the duration (e.g., pulse width) of each programming pulse. Therefore, it is a further embodiment of the present disclosure that the characteristics of the initial applied programming waveform can be a function of the summation of 0s (or 1s) result.

TABLE 2

Initial Programming Pulse Conditions

| Number of lower page 0s to program (% of memory cells) | Initial Programming Pulse Voltage |
|---|---|
| 0-10% | 12 V |
| 11%-20% | 12.5 V |
| 21%-30% | 13 V |
| 31%-40% | 13.5 V |
| 41%-50% | 14 V |

Figure 8:
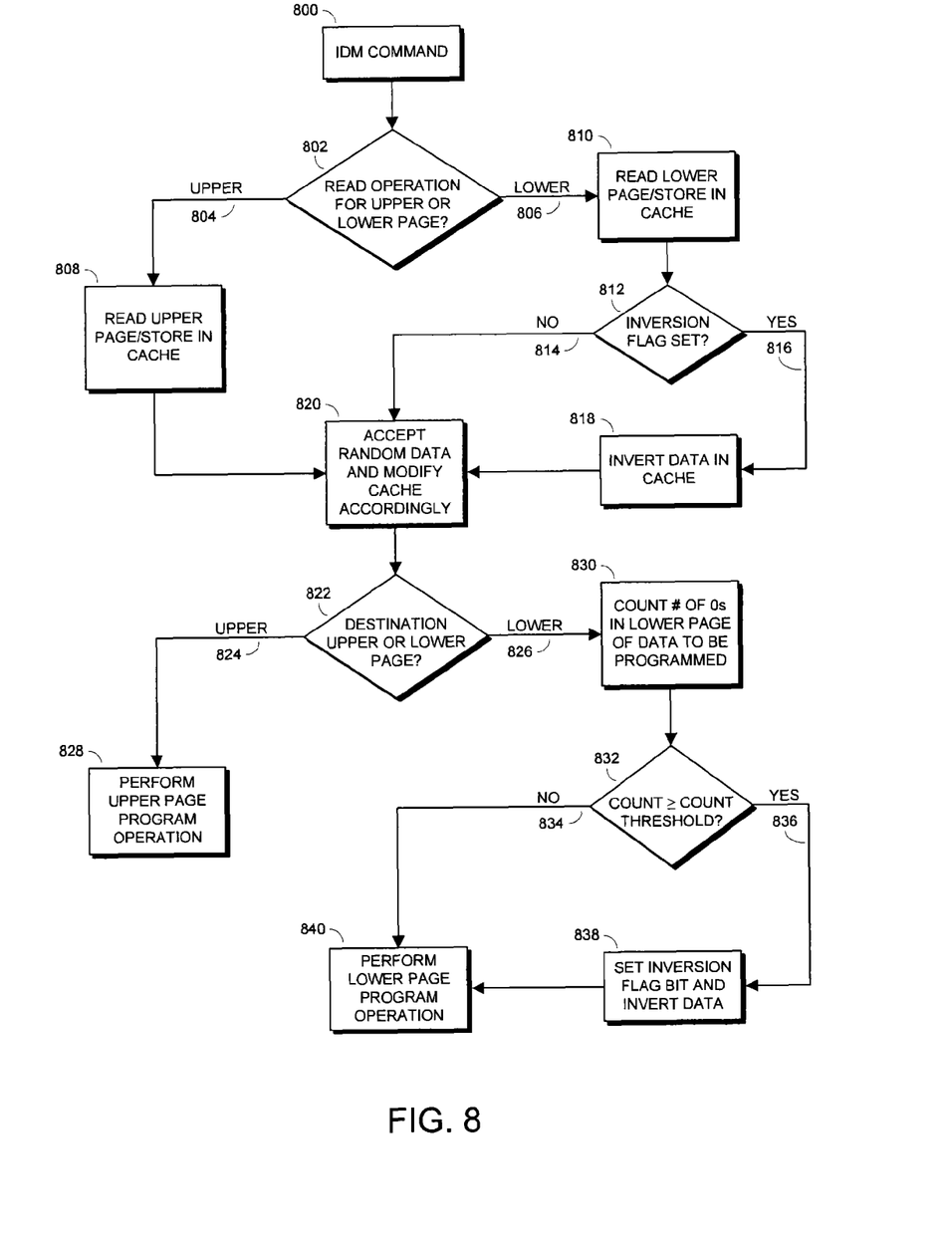
FIG. 8 is a diagram of a flow chart illustrating an internal data move operation according to an embodiment of the disclosure.

FIG. 8 illustrates an internal data move (IDM) according to one or more embodiments of the present disclosure. This can include data that has been conditioned according to various embodiments of the present disclosure and might have an inversion flag associated with it, for example. Such a data move operation can take place internal to the memory device without interaction from a host coupled to the memory device. The internal data move operation can be effectuated by memory device control logic (e.g., control circuitry) such as that discussed subsequently with respect to FIG. 9. Upon the generation of the command to perform the internal data move operation 800, a determination is made 802 to determine if the data to be moved needs to be read from an upper or a lower page. If the data is to be read from an upper page 804, a upper page data read operation is performed and the read data is put into a data cache 808. If the internal data move operation is to read data from a lower page 806, a read operation of the lower page data is performed and the lower page data is put into the data cache 810. A check is performed 812 to determine if the data read from the lower page has an inversion flag associated with it. If the lower page data has a inversion flag that has been set 816 (e.g., the data was previously inverted), an inversion operation is performed on the lower page read data 818. If an associated inversion flag has not been set 814, no inversion operation is performed on the lower page read data. According to various embodiments of the present disclosure, the inversion flag may be read prior to, concurrently with, or subsequent to the read operation 810, for example. Once data, either upper or lower page data, is put into the data cache, additional processing (e.g., modification) of the data may occur 820. This additional processing may occur at the direction of a host coupled to the memory device or may be an internal memory device operation, for example.

Upon completion of any data modification of data residing in the data cache 820, a decision is made 822 to determine if the destination of the data residing in the data cache is to be written to an upper 824 or a lower 826 page location. Data having an upper page destination 824 is then written 828 to the intended upper page location of memory. Data having a lower page destination 826, is subjected to a count operation 830 such as count operation 404 described with respect to FIG. 4 above. If the count is equal to, or exceeds, some particular threshold count value 832/836, an inversion operation is performed on the data and its associated inversion flag bit is set 838. If the count is less than the particular threshold count value 834, no inversion is performed on the data. A programming operation is then performed of the data to the lower page destination in memory 840.

Figure 9:
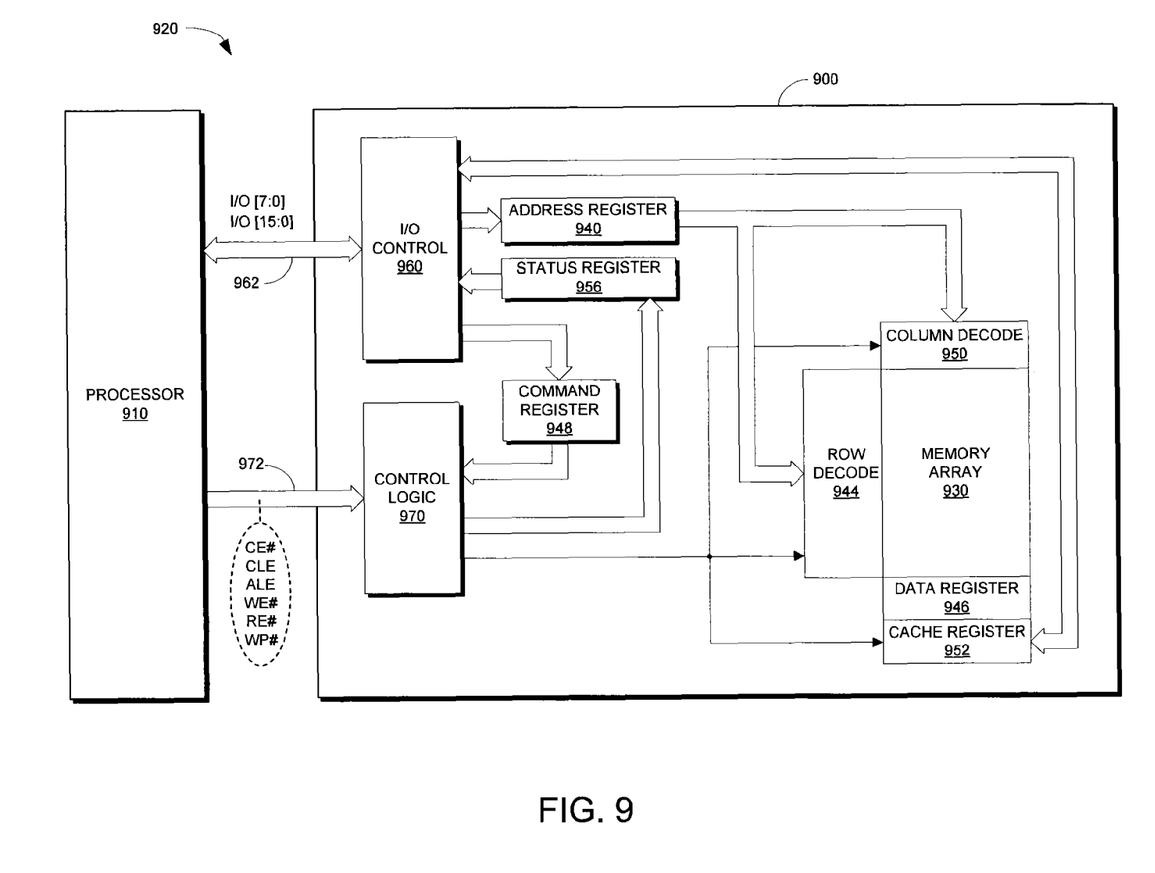
FIG. 9 is a functional block diagram of an electronic system having at least one memory device according to an embodiment of the disclosure.

FIG. 9 is a functional block diagram of an electronic system having at least one memory device 900 according to an embodiment of the present disclosure. The memory device 900 is coupled to a processor 910. The processor 910 can be a microprocessor or some other type of controlling circuitry. The memory device 900 and the processor 910 form part of an electronic system 920. The memory device 900 has been simplified to focus on features of the memory that are helpful in understanding various embodiments of the present disclosure.

The memory device 900 includes an array of memory cells 930 that can be arranged in banks of rows and columns. For example, the memory array can be an array of flash memory cells arranged in a NAND configuration.

Row decode circuitry 944 and column decode circuitry 950 are provided to decode address signals. Address signals are received and decoded to access memory array 930. Memory device 900 also includes input/output (I/O) control circuitry 960 to manage input of commands, addresses and data to the memory device 900 as well as output of data and status information from the memory device 900. An address register 940 is coupled between I/O control circuitry 960, row decode circuitry 944 and column decode circuitry 950 to latch the address signals prior to decoding. A command register 948 is coupled between I/O control circuitry 960 and control logic 970 to latch incoming commands. Control logic 970 controls access to the memory array 930 in response to the commands and generates status information for the external processor 910. The control logic 970 is coupled to row decode circuitry 944 and column decode circuitry 950 to control the row decode circuitry 944 and column decode circuitry 950 in response to the addresses. Control logic 970 also comprises in part, various structures and circuits in order to facilitate implementation of various embodiments of the present disclosure. For example, control logic 970 can include a state machine and/or various logic circuitry and control registers.

Control logic 970 is also coupled to one or more registers such as cache register 952 and/or data register 946. According to one or more embodiments of the present disclosure, the data cache described above with respect to FIG. 8 can be comprised of the cache register 952 and/or the data register 946, for example. Cache register 952 latches data, either incoming or outgoing, as directed by control logic 970 to temporarily store data while the memory array 930 is busy writing or reading, respectively, other data. During a write operation, data is passed from the cache register 952 to data register 946 for transfer to the memory array 930; then new data is latched in the cache register 952 from the I/O control circuitry 960. During a read operation, data is passed from the cache register 952 to the I/O control circuitry 960 for output to the external processor 910; then new data is passed from the data register 946 to the cache register 952. The cache register 952 and the data register 946 may comprise various analog (e.g., sense devices) and/or digital circuitry as are known to those skilled in the art. A status register 956 is coupled between I/O control circuitry 960 and control logic 970 to latch the status information for output to the processor 910.

Memory device 900 receives control signals at control logic 970 from processor 910 over a control link 972. The control signals present on the control link 972 may include a chip enable CE#, a command latch enable CLE, an address latch enable ALE, a write enable WE#, a read enable RE# and a write protect WP# signal. Memory device 900 receives commands (in the form of command signals), addresses (in the form of address signals), and data (in the form of data signals) from processor 910 over a multiplexed input/output (I/O) bus 962 and outputs data to processor 910 over I/O bus 962.

Specifically, the commands are received over input/output (I/O) pins [7:0] of I/O bus 962 at I/O control circuitry 960 and are written into command register 948. The addresses are received over input/output (I/O) pins [7:0] of bus 962 at I/O control circuitry 960 and are written into address register 940. The data are received over input/output (I/O) pins [7:0] for an 8-bit device or input/output (I/O) pins [15:0] for a 16-bit device at I/O control circuitry 960 and are written into cache register 952. The data are subsequently written into data register 946 for programming memory array 930. For another embodiment, cache register 952 may be omitted, and the data are written directly into data register 946. Data are also output over input/output (I/O) pins [7:0] for an 8-bit device or input/output (I/O) pins [15:0] for a 16-bit device 962. It will be appreciated by those skilled in the art that additional circuitry and signals can be provided, and that the memory device of FIG. 9 has been simplified to help focus on the present disclosure. Additionally, while the memory device of FIG. 9 has been described in accordance with popular conventions for receipt and output of the various signals, it is noted that various embodiments of the present disclosure are not limited by the specific signals and I/O configurations described unless expressly noted herein.

CONCLUSION

Memory devices and methods have been described capable of providing data conditioning of lower page data values in order to statistically reduce the number of memory cells that are programmed to higher threshold voltage ranges. This statistical reduction in memory cells programmed to higher threshold voltage ranges facilitates benefits of reduced gate stress in the memory devices, reduced programming time, a reduction in program disturb effects, an increase in reliability and/or a reduction in the number and magnitude of programming pulses applied to memory cells of the memory device.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
a plurality of multilevel memory cells comprising a page of memory cells;
input circuitry configured to receive external data comprising a plurality of data values each data value to be stored in a different memory cell of the page of memory cells, wherein each data value comprises a plurality of digits; and
control circuitry configured to determine whether a majority of memory cells of the page of memory cells are to be programmed to threshold voltages above an intermediate point of all threshold voltages used to represent possible data states of the memory device and, if a majority of the memory cells of the page of memory cells are to be programmed to threshold voltages occurring above the intermediate point, the control circuitry is configured to program the majority of the memory cells to threshold voltages below the intermediate point.

2. The memory device of claim 1, wherein the control circuitry is further configured to perform a cumulative current measurement while storing data to be written to the page of memory cells and to perform a comparison of the cumulative current measurement and a reference current to determine a count of memory cells to be programmed to threshold voltages above the intermediate point.

3. The memory device of claim 1, wherein the control circuitry is further configured to utilize a digital adder, a serial adder, a ripple carry adder, or a carry look ahead adder to determine a count of memory cells to be programmed to threshold voltages above the intermediate point.

4. The memory device of claim 1, wherein the control circuitry is further configured to determine whether the majority of memory cells of the page of memory cells are to be programmed to threshold voltages above an intermediate point in response to determining that the external data are be to be programmed to a lower page of the multilevel memory cells.

5. A method of operating a multi-state memory device, comprising:
determining whether a majority of a plurality of memory cells are to be programmed to threshold voltages above an intermediate point of all threshold voltages used to represent possible data states of the memory device; and
if a majority of the plurality of memory cells are to be programmed to threshold voltages occurring above the intermediate point, programming the majority of the memory cells to threshold voltages below the intermediate point.

6. The method of claim 5, wherein determining whether a majority of a plurality of memory cells are to be programmed to threshold voltages above an intermediate point of all threshold voltages used to represent possible data states of the memory device comprises performing a cumulative current measurement of currents indicative of data to be written to the plurality of memory cells and performing a comparison of the cumulative current measurement and a reference current.

7. The method of claim 5, wherein the plurality of memory cells are a plurality of first memory cells located at a first memory location of the memory device and further comprising receiving the data to be written to the plurality of first memory cells at a cache from a plurality of second memory cells located at a second memory location of the memory device before determining whether a majority of the plurality of first memory cells are to be programmed to threshold voltages above the intermediate point.

8. The method of claim 7, further comprising inverting the data to be written to the plurality of first memory cells before receiving the data to be written to the plurality of first memory cells at the cache.

9. The method of claim 8, wherein inverting the data to be written to the plurality of first memory cells is in response to reading an inversion flag associated with the data to be written to the plurality of first memory cells.

10. The method of claim 9, further comprising reading the data to be written to the plurality of first memory cells from a lower page of the second memory cells; wherein the inversion flag is read prior to, concurrently with, or subsequent to reading the data to be written to the plurality of first memory cells from the lower page.

11. The method of claim 5, further comprising performing an inversion operation on data values programmed into memory cells of the majority of the memory cells programmed to threshold voltages below the intermediate point prior to output of the data values from the memory device during a read operation.

12. The memory device of claim 2, wherein the cumulative current measurement performed while storing data to be written to the page of memory cells is performed in a data cache of the memory device.

13. The memory device of claim 1, wherein if less than a majority of the memory cells of the page of memory cells are to be programmed to threshold voltages occurring above the intermediate point, the control circuitry is configured to program the memory cells of the page of memory cells that are to be programmed to threshold voltages occurring above the intermediate point to threshold voltages above the intermediate point and to program memory cells of the page of memory cells that are to be programmed to threshold voltages occurring below the intermediate point to threshold voltages below the intermediate point.

14. The memory device of claim 1, wherein if the majority of the memory cells of the page of memory cells are to be programmed to threshold voltages occurring above the intermediate point, the control circuitry is configured to program memory cells of the page of memory cells that are to be programmed to threshold voltages occurring below the intermediate point to threshold voltages above the intermediate point.

15. The memory device of claim 1, wherein the control circuitry is configured to base a magnitude or a magnitude and width of an initial programming pulse applied to the page of memory cells on a number of the memory cells to be programmed to the threshold voltages above the intermediate point.

16. The memory device of claim 1, wherein the control circuitry is configured to perform an inversion operation on data values programmed into memory cells of the majority of the memory cells programmed to threshold voltages below the intermediate point prior to output of the data values from the memory device during a read operation.

17. The memory device of claim 1, wherein the threshold voltages below the intermediate point correspond to erased states of the majority of the memory cells.

18. The method of claim 5, further comprising, if less than a majority of the memory cells of the plurality of memory cells are to be programmed to threshold voltages occurring above the intermediate point, programming the memory cells of the plurality of memory cells that are to be programmed to threshold voltages occurring above the intermediate point to threshold voltages above the intermediate point and programming memory cells of the plurality of memory cells that are to be programmed to threshold voltages occurring below the intermediate point to threshold voltages below the intermediate point.

19. The method of claim 5, further comprising, if the majority of the memory cells of the plurality of memory cells are to be programmed to threshold voltages occurring above the intermediate point, programming memory cells of the plurality of memory cells that are to be programmed to threshold voltages occurring below the intermediate point to threshold voltages above the intermediate point.

20. The method of claim 5, wherein the threshold voltages below the intermediate point correspond to erased states of the majority of the memory cells.

21. The method of claim 5, wherein programming comprises applying an initial programming pulse to the plurality of memory cells having a magnitude or a magnitude and width based on a number of the memory cells to be programmed to threshold voltages above the intermediate point.

22. A method of operating a multi-state memory device, comprising:
    determining whether a majority of a plurality of memory cells are to be programmed to threshold voltages above an intermediate point of all threshold voltages used to represent possible data states of the memory device;
    if a majority of the plurality of memory cells are to be programmed to threshold voltages occurring above the intermediate point, programming the majority of the memory cells to threshold voltages below the intermediate point and programming memory cells of the plurality of memory cells that are to be programmed to threshold voltages occurring below the intermediate point to threshold voltages above the intermediate point; and
    if less than a majority of the memory cells of the plurality of memory cells are to be programmed to threshold voltages occurring above the intermediate point, programming the memory cells of the plurality of memory cells that are to be programmed to threshold voltages occurring above the intermediate point to threshold voltages above the intermediate point and programming memory cells of the plurality of memory cells that are to be programmed to threshold voltages occurring below the intermediate point to threshold voltages below the intermediate point.

23. The memory device of claim 22, wherein programming any memory cells of the plurality of memory cells to threshold voltages below the intermediate point comprises leaving those memory cells at an erased state.

* * * * *

UNITED STATES PATENT AND TRADEMARK OFFICE
CERTIFICATE OF CORRECTION

PATENT NO. : 8,467,242 B2
APPLICATION NO. : 12/968529
DATED : June 18, 2013
INVENTOR(S) : Brandon Lee Fernandes Page 1 of 1

It is certified that error appears in the above-identified patent and that said Letters Patent is hereby corrected as shown below:

In the Claims:

In column 13, lines 37-38, in Claim 4, after "are" delete "be".

Signed and Sealed this
Seventeenth Day of September, 2013

Teresa Stanek Rea
*Deputy Director of the United States Patent and Trademark Office*